United States Patent
Lee

(10) Patent No.: US 8,248,121 B2
(45) Date of Patent: Aug. 21, 2012

(54) PHASE LOCK LOOP AND CONTROL METHOD THEREOF

(75) Inventor: Wei-Jie Lee, Hsinchu County (TW)

(73) Assignee: Richwave Technology Corp., Taipei (TW)

( * ) Notice: Subject to any disclaimer, the term of this patent is extended or adjusted under 35 U.S.C. 154(b) by 164 days.

(21) Appl. No.: 12/729,294

(22) Filed: Mar. 23, 2010

(65) Prior Publication Data

US 2011/0057695 A1    Mar. 10, 2011

(30) Foreign Application Priority Data

Sep. 7, 2009  (TW) .............................. 98130035 A

(51) Int. Cl.
    *H03L 7/06*    (2006.01)

(52) U.S. Cl. ........... 327/156; 327/147; 327/157; 331/17

(58) Field of Classification Search .................. 327/147, 327/156, 157; 331/17
See application file for complete search history.

(56) References Cited

U.S. PATENT DOCUMENTS

| | | | |
|---|---|---|---|
| 6,867,655 B2 * | 3/2005 | McCarthy | 331/25 |
| 7,880,516 B2 * | 2/2011 | Beaulaton et al. | 331/17 |

* cited by examiner

*Primary Examiner* — John Poos
*(74) Attorney, Agent, or Firm* — Thomas|Kayden

(57) ABSTRACT

A phase lock loop (PLL) featuring automatic stabilization is provided, in which a first charge pump is coupled to a driving control signal to generate a first current, a filter with a zero-point path and the first charge pump are coupled at a first node, and a current adjustment circuit adjusts a current on the first node according to a voltage difference in the zero-point path.

31 Claims, 13 Drawing Sheets

1

PHASE LOCK LOOP AND CONTROL METHOD THEREOF

CROSS REFERENCE TO RELATED APPLICATIONS

This Application claims priority of Taiwan Patent Application No. 098130035, filed on Sep. 7, 2009, the entirety of which is incorporated by reference herein.

BACKGROUND OF THE INVENTION

1. Field of the Invention

The invention relates to a phase lock loop, in particular to a circuit for accelerating frequency locking.

2. Description of the Related Art

Phase lock loop is a technology for synthesizing the frequency signal. FIG. 1 shows a conventional phase lock loop 100 receiving a low-frequency reference signal $f_{REF}$ for synthesizing a high-frequency output signal $f_{VCO}$. The frequency divider 150 divides the output signal $f_{VCO}$ by a frequency division ratio N, and feedbacks a divided result $f_{DIV}$ to an input terminal of the phase lock loop 100. At the input terminal of the phase lock loop 100, a phase frequency detector 110 compares the phase of the reference signal $f_{REF}$ with the phase of the divided result $f_{DIV}$, and generates a pull-up signal #U and a pull-down signal #D according to phase difference between the reference signal $f_{REF}$ and the divided result $f_{DIV}$. For example, when the reference signal $f_{REF}$ leads the divided result $f_{DIV}$, the phase frequency divider 110 outputs the pull-up signal #U. On the contrary, when the reference signal $f_{REF}$ lags the divided result $f_{DIV}$, the phase frequency divider 110 outputs the pull-down signal #D. A charge pump 120 is coupled to the phase frequency detector 110, and converts the pull-up signal #U and the pull-down signal #D into a driving current $i_P$. The driving current $i_P$ then passes through a low-pass filter 130 consisting of a resistor $R_A$ and two capacitors $C_A$ and $C_B$, and is transformed into a driving voltage $V_{tune}$ used for adjusting a voltage-control oscillator (VCO) 140. Eventually, the voltage-control oscillator 140 generates the output signal $f_{VCO}$ according to the driving current $V_{tune}$.

The phase lock loop (PLL) 100 forms a feedback mechanism. The driving voltage $V_{tune}$ generated by the VCO 140 usually swings for a period of time, and converges slowly to a target driving voltage in frequency tracking process. The period of time is also referred to as a locking time. When the frequency of the output signal $f_{VCO}$ is not locked, a loop bandwidth determines the change rate of the driving voltage $V_{tune}$. If the loop bandwidth is wide, the driving voltage $V_{tune}$ converges rapidly, but the phase lock loop is susceptible to noise. On the contrary, if the loop bandwidth is narrow, the driving voltage $V_{tune}$ converges slowly, but it takes a longer time. In order to meet the demands of the rapid frequency hopping function and low phase noise for a wireless communication system in a conventional phase lock loop, rapid frequency locking is facilitated by increasing the current of the charge pump and decreasing the resistor $R_A$ of the low-pass filter to widen the loop bandwidth when the frequency is not be locked. Additionally, the current of the charge pump is decreased and the resistor $R_A$ of the low-pass filter is increased to narrow the loop bandwidth when the frequency is locked. However, in the rapid frequency locking process the switching of the loop bandwidth between the above two modes readily causes signal perturbation of the driving voltage $V_{tune}$ that controls the VCO 140. For example, because the loop bandwidth is suddenly changed from a wider one to a narrower one, the resistor $R_A$ of the filter is switched to high resistance. However, the current flowing through the resistor is still very large, which equals to a high voltage drop across the resistor $R_A$. As a result, it forms a voltage step for the output signal of the low-pass filter 130 (i.e. the driving voltage $V_{tune}$). The voltage step makes the phase lock loop depart from the locked frequency, and therefore the phase lock loop needs to be tracked again. Because the loop bandwidth has already switched to the narrower one at this moment, it takes a longer time to track the phase of the phase lock loop. The phenomenon does not satisfy the original purpose of rapid frequency locking. This phenomenon becomes worse for the fractional-N type frequency synthesizer. Therefore, a more rapid and stable phase lock loop is required.

BRIEF SUMMARY OF THE INVENTION

The invention provides a phase lock loop, comprising a first charge pump, a filter and a current adjustment circuit. The first charge pump is coupled to a driving control signal for generating a first current. The filter and the first charge pump are coupled at a first node, wherein the filter comprises a zero-point path. The current adjustment circuit adjusts the current on the first node according to the voltage drop in the zero-point path.

The invention also provides a control method for a phase lock loop, wherein the phase lock loop comprises a phase frequency detector, a first charge pump, a low-pass filter, a voltage-control oscillator and a frequency divider, in which the first charge pump and the low-pass filter are coupled at a first node, and the control method comprises: generating a first current outputting to the first node according to a driving control signal; and adjusting the current on the first node according to the voltage drop in the zero-point path of the low-pass filter.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The embodiment according to the invention discloses an improved phase lock loop, which provides the phase lock loop with an automatically-stabilizing mechanism capable of adjusting loop bandwidth of the phase lock loop by current adjustment, such that a phase lock loop capable of rapid frequency locking can be achieved. This method adjusting the current on the node at which the charge pump and the low-pass filter are coupled according to the voltage drop of a zero-point path of the phase lock loop.

Figure 2A:
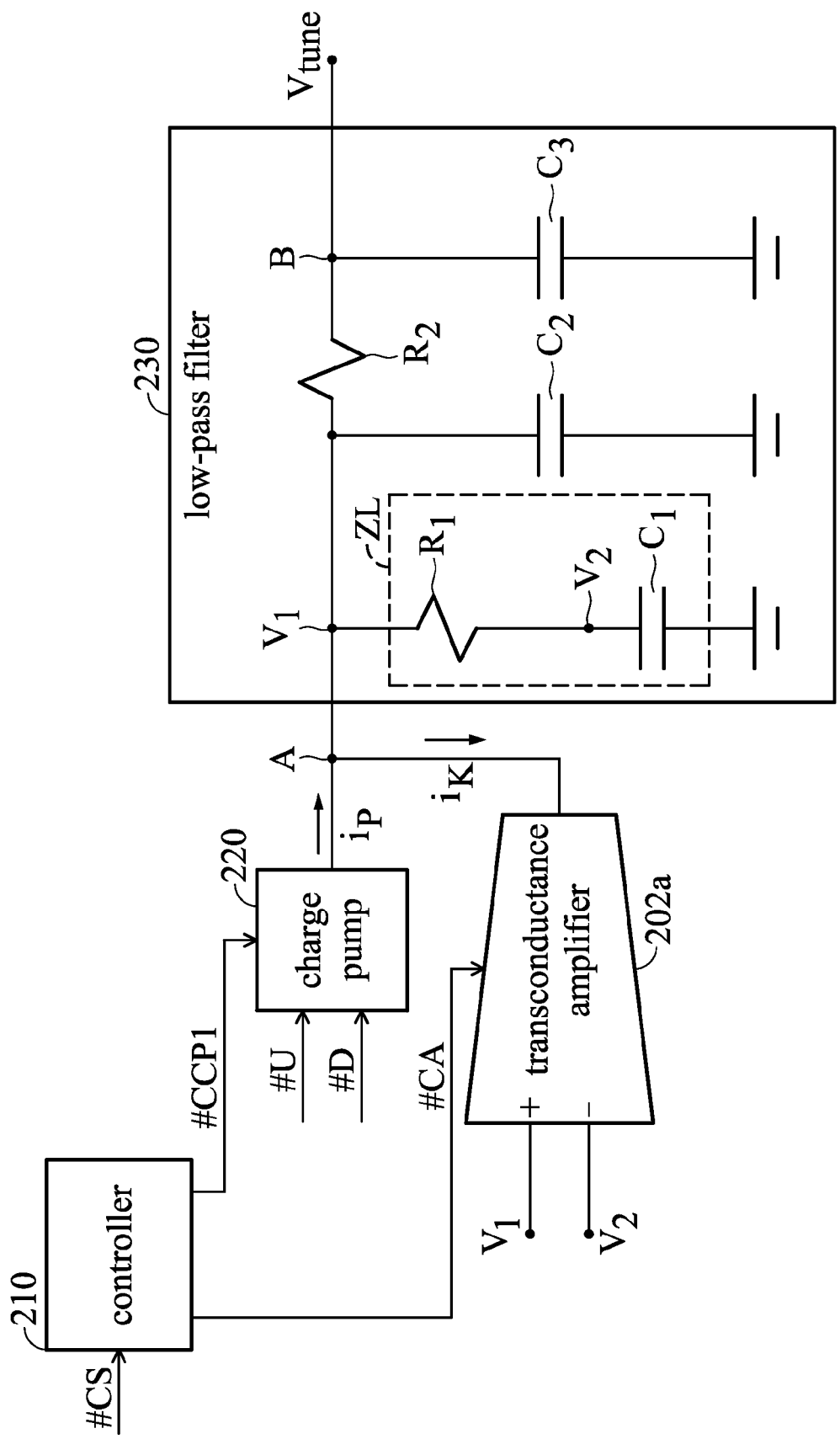
FIG. 2a shows a transconductance amplifier, a controller, a charge pump and a low-pass filter according to the invention.

FIG. 2a is an embodiment according to the invention. As shown in the FIG. 2a, the phase lock loop comprises a charge pump 220, a low-pass filter 230, a controller 210 and a transconductance amplifier 202a. In the embodiment, the charge pump 220 receives a driving control signal (such as pull-up signal #U and pull-down signal #D) output from the phase frequency detector 110 for generating a driving current $i_P$, and the low-pass filter 230 generates a driving voltage $V_{tune}$ according to the current on a node A at which the charge pump 220 and the low-pass filter are coupled. The transconductance amplifier 202a adjusts the current nod the node A according to the voltage drop of a zero-point path ZL of the low-pass filter 230 for reducing the influence of the driving current $i_P$ on the low-pass filter 230. When the phase lock loop changes the driving current ip for rapid frequency locking, the current $i_K$ output from the transconductance amplifier 202a is also changed; hence the phase lock loop locks on rapidly and stably in the whole frequency tracking process. As shown in FIG. 2a, the output terminal of the charge pump 220 is coupled to the node A, and the charge pump 220 provides and draws the driving current $i_P$ after the charge pump 220 receives the pull-up signal #U and pull-down signal #D transmitted from the phase frequency detector 110. In the actual operation of the phase lock loop, although the pull-up signal #U and pull-down signal #D may act simultaneously for a short period, the pull-up signal #U is still regarded as an exclusive signal in contrast with the pull-down signal #D; that is, if one of the pull-up signal #U and pull-down signal #D is enabled, then the other one is disabled. Accordingly, the charge pump 220 generates the driving current $i_P$ according to one of the pull-up signal #U and pull-down signal #D at that moment, and determines the flow direction of the driving current $i_P$. For example, when the pull-up signal #U is enabled, the charge pump 220 serves as a current source providing the driving current $i_P$ to node A. On the contrary, when the pull-down signal #D is enabled, the charge pump 220 serves as a current sink drawing the driving current $i_P$ from the node A.

As shown in FIG. 2a, node A is an input terminal of the low-pass filter 230. The driving current $i_P$ and current $i_K$ drive the low-pass filter 230 to generate the driving voltage $V_{tune}$. Generally, the low-pass filter 230 can be formed by capacitor(s) and resistor(s), and can also be regarded as an equivalent frequency transfer function composed of one or more zero-point(s) and pole(s). Mathematical derivations are not described here for brevity. For detail information, refer to a textbook about microelectronics.

In one preferred embodiment according the invention, one transconductance amplifier 202a is utilized to couple with the low-pass filter 230. As show in FIG. 2a, the low-pass filter 230 includes a zero-point path ZL, a resistor $R_2$ and two capacitors $C_2$ and $C_3$, in which the zero-point path ZL includes at least a resistor $R_1$ and a capacitor C1 connected in series to the node A, and the zero-point path ZL determines the zero-point(s) of the equivalent transfer function of the low-pass filter 230. Furthermore, the resistor $R_1$ has a first terminal coupled to the node A and a second terminal coupled to the capacitor $C_1$, and the capacitor $C_1$ has a first terminal coupled to the second terminal of the resistor $R_1$ and a second terminal coupled to the ground. A capacitor $C_2$ has a first terminal coupled to the node A and a second terminal coupled to the ground. A resistor $R_2$ has a first terminal coupled to the first node A and a second terminal coupled to a node B, and the capacitor $C_3$ has a first terminal coupled to the second terminal of the second resistor $R_2$ and a second terminal coupled to the ground, in which the node B outputs the driving voltage $V_{tune}$. The low-pass filter 230 as shown in FIG. 2a may have various implementations, and is not limited thereto.

The embodiment according to the invention provides a transconductance amplifier 202a having a first terminal coupled to the first terminal of the resistor $R_1$, a second terminal coupled to the second terminal of the resistor $R_1$ and an output terminal coupled to the node A. Note that node A is coupled to the first terminal of the resistor $R_1$. The transconductance amplifier 202a detects the voltage difference between the two terminals of the resistor $R_1$ and determines the magnitude of the current $i_K$, and the sign of the voltage difference determines the flowing direction of the current $i_K$. For example, the voltages of the two terminals of the resistor $R_1$ are $V_1$ and $V_2$, respectively. When $V_1$ is greater than $V_2$, the transconductance amplifier 202a sinks the current $i_K$ from the node A to decrease the current flowing through the resistor $R_1$. On the contrary, when $V_2$ is greater than $V_1$, the transconductance amplifier 202a provides the current $i_K$ to the node A to increase the current flowing through the resistor $R_1$. It should be noted that the magnitude of the current $i_K$ can be regarded as the magnitude of the current on the node A which is adjusted by the transconductance amplifier 202a Because the transconductance amplifier 202a provides or sinks the current $i_K$ on the node A according to the voltages (i.e., $V_1$ and $V_2$) of the two terminals of the resistor $R_1$.

As described, the transconductance amplifier 202a shown in FIG. 2a is an additional circuit which is implanted to make the phase lock loop become automatically-stable. The main function of the transconductance amplifier 202a is to diminish the influence of the driving current $i_P$ on the low-pass filter 230 by current adjustment. In this way, the phase lock loop maintains enough phase margins in the whole frequency tracking process; as a result, the phase lock loop is maintained in a stable state. The actual circuit configurations of the transconductance amplifier 202a may be an active voltage-to-current mechanism to make the current $i_K$ be proportional to the voltage difference between $V_1$ and $V_2$. For example, the transconductance amplifier 202a may be realized by an operational amplifier (OP amplifier) with the transform function represented as follows:

$$i_K = g_m(V_1 - V_2),$$

where $i_K$ is the current generated by the transconductance amplifier 202a, and gm is a specific magnification (transconductance gain). The sign obtained from V1 minus V2 determines the flow direction of the current $i_K$.

Figure 1:
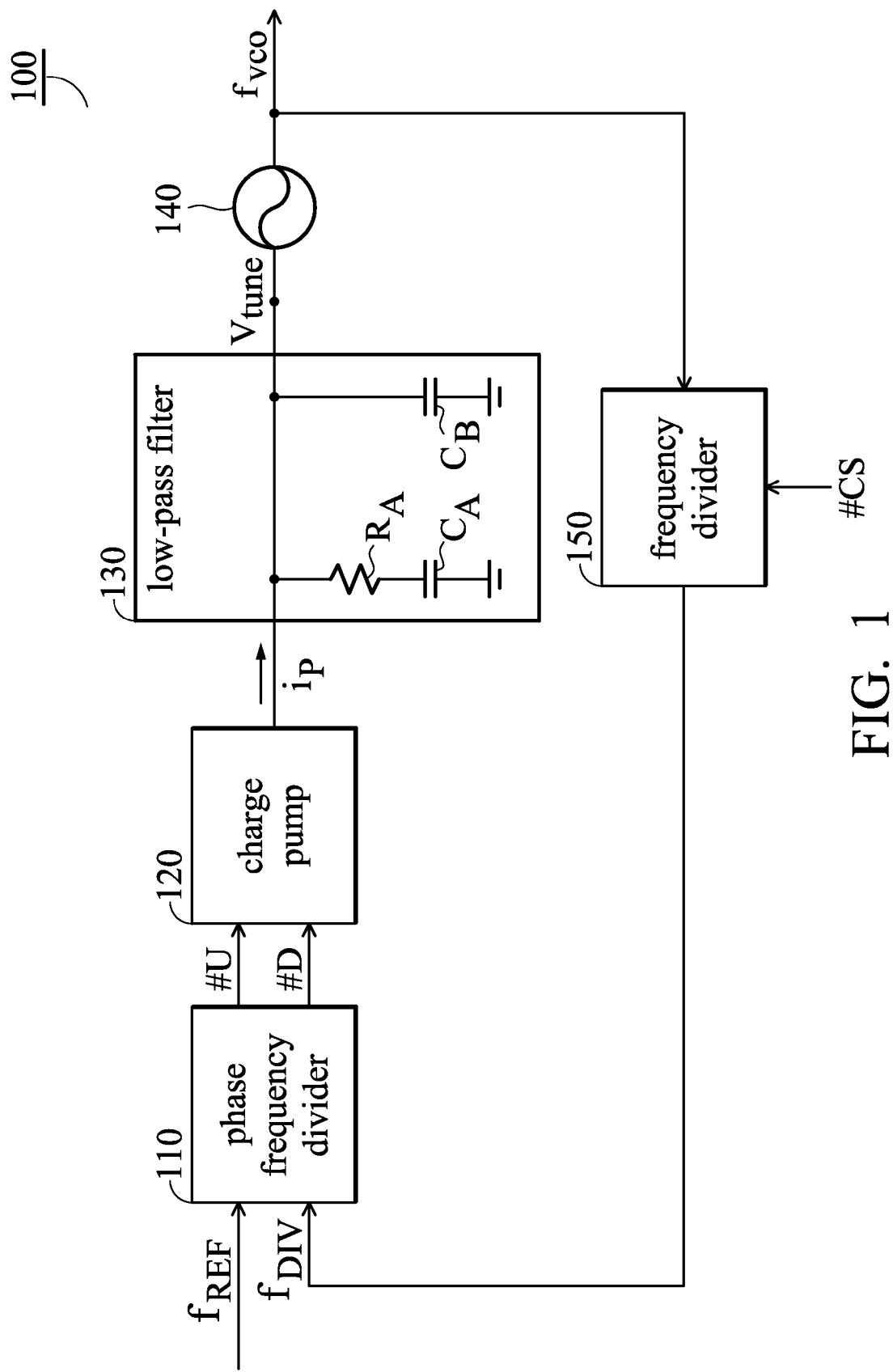
FIG. 1 is a block diagram of a typical phase lock loop.

The driving voltage $V_{tune}$ output from the low-pass filter 230 is then applied to the voltage-control oscillator 140, the frequency divider 150 and the phase frequency detector 110 shown in FIG. 1 to form a complete loop. For example, the voltage-control oscillator 140 is coupled to the output terminal of the low-pass filter 230 and generates the output signal $f_{VCO}$ according to the driving voltage $V_{tune}$. The frequency divider 150 is coupled to the output terminal of the voltage-control oscillator 140 and generates the divided result $f_{DIV}$ by dividing the output signal $f_{VCO}$ by the frequency division ratio N. The phase frequency detector 110 receives the reference signal $f_{REF}$ and the divided result $f_{DIV}$, and outputs the pull-up signal #U and pull-down signal #D according to the phase relation between the reference signal $f_{REF}$ and the divided result $f_{DIV}$. There are many known technologies about the voltage-control oscillator 140, the frequency divider 150 and the phase frequency detector 110, so their detailed circuit configurations are not described here for brevity. In the embodiment according to the invention, the voltage-control oscillator 140, the frequency divider 150 and the phase frequency detector 110 accompany the transconductance amplifier 202a to improve the phase lock loop.

In addition, another preferred embodiment, the invention can support multi-channel switching of the phase lock loop. For example, the frequency divider 150 receives a channel selection signal #CS and adjusts the frequency division ratio N according to the channel selection signal #CS, and hence the phase lock loop 100 can switch the output signal $f_{VCO}$ from the phase lock loop 100 to a different frequency band. In particular, the reference signal $f_{REF}$ and the desired division ratio N both determine the frequency band of the output signal $f_{VCO}$.

When the channel needs to be switched, the channel selection signal #CS is changed for making the frequency divider 150 to select a different frequency division ratio N. However, when the frequency division ratio N is switched, the driving voltage $V_{tune}$ will oscillate severely and takes a period of time to converge to a new target voltage. The loop bandwidth and the loop gain are used to represent the sensitivity index of the phase lock loop. The loop bandwidth and the loop gain are mainly affected by the current on the node A (i.e., the driving current $i_P$ output from the charge pump 220 and the current generated by the generated by the transconductance amplifier 202a). A greater magnitude of the current on the node A causes a wider loop bandwidth and a greater loop gain, and hence the driving voltage $V_{tune}$ oscillates rapidly with high amplitude. On the contrary, a smaller magnitude of the current on the node A causes a narrower loop bandwidth and a smaller loop gain, and hence the driving voltage $V_{tune}$ swings slowly with low amplitude The wider loop bandwidth can make the driving voltage $V_{tune}$ adjust rapidly to the target voltage; however, the phase lock loop is more susceptible to noise. Although the narrower loop bandwidth can increase the noise immunity, the consequence of the loop bandwidth reduction is an increase of the PLL locking time. On the other hand, the phase margin is used to represent the stability index of the phase lock loop. According to the design criteria of the phase lock loop, the phase margin must be greater than 45 degree when the open-loop gain is 0 db, and hence the phase lock loop can meet the demand of stability. The phase margin is mainly affected by the time constants (RC) of the low-pass filter 230. For the entire phase lock loop, the phase margin varies with the loop bandwidth. If the loop bandwidth is changed only by varying the charge pump current, the phase lock loop very apt to loose sufficient phase margins and; as a result, start to oscillate. Accordingly, a solution mechanism is required.

In order to make the channel switching process converged more rapidly and stably, FIG. 2a further includes a controller 210. According to whether the channel selection signal #CS has been changed or not, the controller 210 controls the magnitude of the driving current $i_P$ of the charge pump 220 through a first control signal #CCP1 and the magnitude of the current $i_K$ of the transconductance amplifier 202a through a current control signal #CA. The controller 210 adopts a way of segmented adjustment to adjust the loop bandwidth dynamically, and hence maintains the advantages of the wide and narrow loop bandwidth. Meanwhile, the controller 210 dynamically adjusts the transconductance amplifier 202a to affect the operational characteristics of the low-pass filter 230, and hence the loop bandwidth is always maintained within the optimum phase margin in channel switching process. The controller 210 operates as following description.

First, when the phase lock loop maintains the state of locking, the first control signal #CCP1 and the current control signal #CA individually operate with stable value such that the entire phase lock loop operates stably. The controller 210 monitors whether the value of the channel selection signal #CS changes or not. If the value of the channel selection signal #CS changes, the controller 210 increases the first control signal #CCP1 by the specific magnification, such as a very high initial value, to increase the loop bandwidth and the loop gain, and then performs (i.e. initiates) the channel switching process of the segmented adjustment. Meanwhile, the controller 210 also adjusts the value of the current control signal #CA synchronously, such that the later value of the phase margin is still within the optimum phase margin due to the current $i_K$ generated by the transconductance amplifier 202a during channel switching process.

In the cannel switching process, once the frequency wants to lock finishes or approaches the locking, the controller 210 decreases the values of the first control signal #CCP1 and the current control signal #CA with time to make the magnitudes of the driving current $i_P$ and the current $i_K$ also decrease synchronously with time. In particular, the lowering of the driving current $i_P$ and current $i_K$ is separated into multi-stages. The controller 210 lowers the values of the driving current $i_P$ and current $i_K$ once per regular time intervals until the driving current $i_P$ is lowered to a specific value, which equals a smaller loop bandwidth of the phase lock loop. When the phase lock loop reaches the specific loop bandwidth, the controller 210 stops changing the values of the first control signal #CCP1 and the current control signal #CA to finish the channel switching process. The current $i_K$ may be lowered to zero in the channel switching process.

Figure 2B:
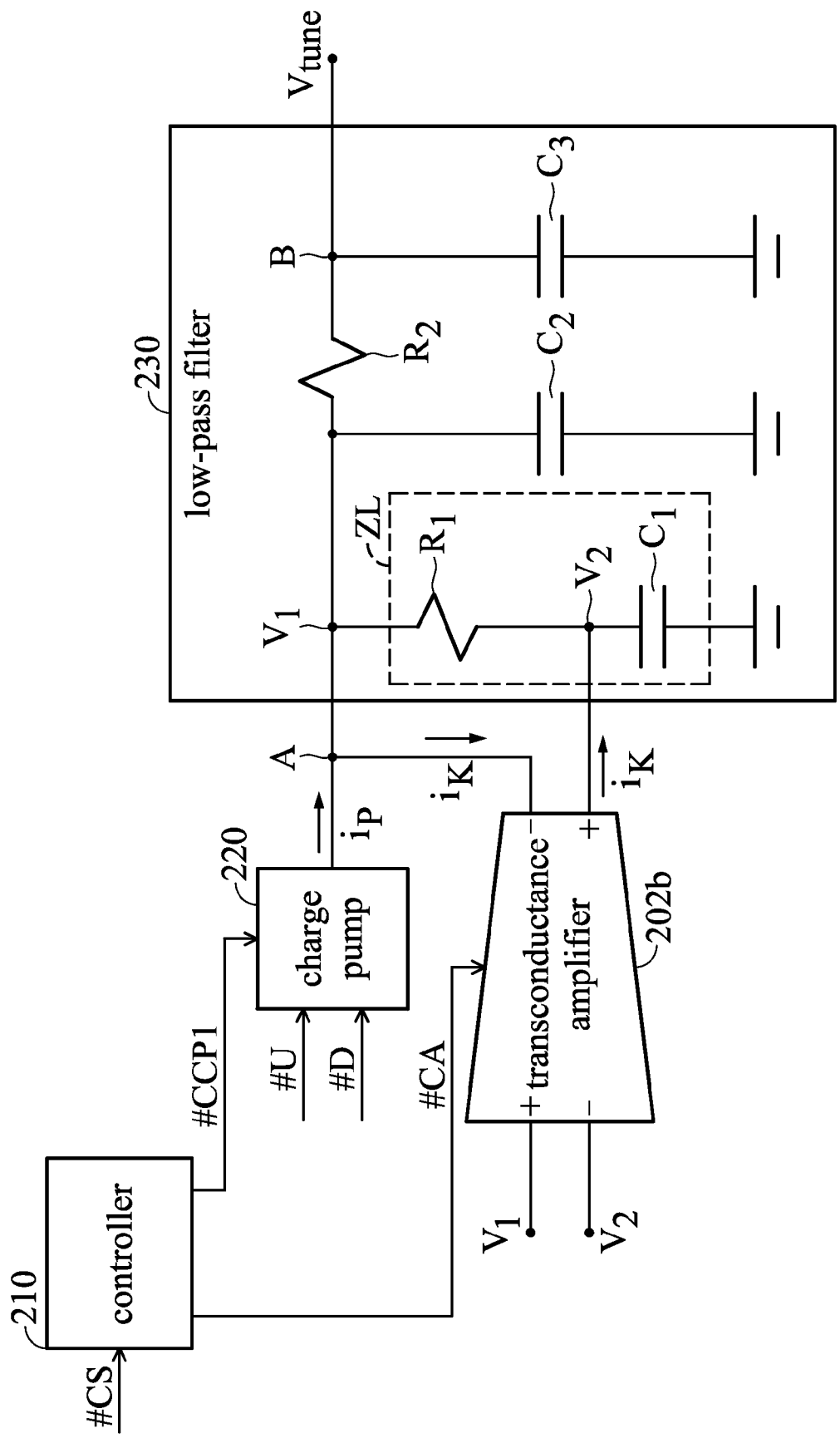
FIG. 2b shows a transconductance of another embodiment according to the invention.

FIG. 2b shows a transconductance amplifier 202b according to another preferred embodiment of the invention. In the embodiment, the transconductance amplifier 202b is improved into the configuration with two output terminals. Similar to the transconductance amplifier 202a shown in FIG. 2a; however, the transconductance amplifier 202b has a first output terminal connected to the node A (i.e. the first terminal of the resistor $R_1$) and a second output terminal connected to the second terminal of the resistor $R_1$. The transconductance amplifier 202b conducts the current $i_K$ from the node A to the second terminal of the resistor $R_1$. In this way, the current flowing through the capacitor $C_1$ equals the driving current $i_P$ output from the charge pump 220; however, when $V_1$ is greater than $V_2$, the current flowing through the resistor $R_1$ is decreased because the transconductance amplifier 202b sinks the current $i_K$ from the node A. Therefore, the zero-point of the frequency transfer function formed by the series connection of the resistor $R_1$ and the capacitor $C_1$ is changed such that the driving voltage $V_{tune}$ is stabilized for the phase lock loop 100. The controller 210, charge pump 220 and low-pass filter 230 are similar to those shown in FIG. 2a, and can be applied to the phase lock loop 100 shown in FIG. 1.

Figure 2C:
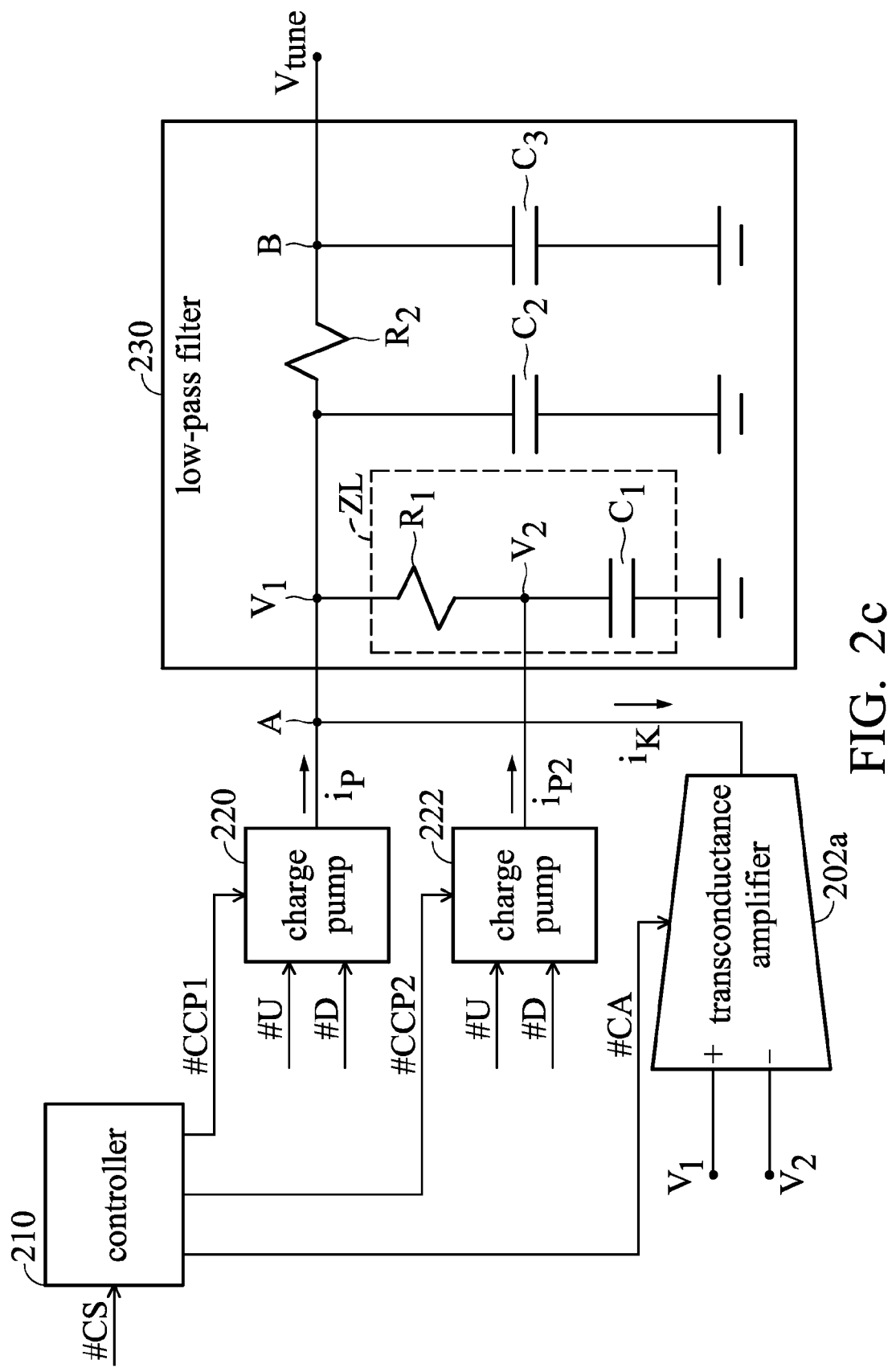
FIG. 2c shows a transconductance amplifier and a second charge pump according to the invention.

FIG. 2c is another preferred embodiment according to the invention. Similar to FIG. 2a; however, a charge pump 222 is added to the embodiment. In order to enhance the charging ability of the capacitor $C_1$, the charge pump 222 is coupled to the second terminal of the resistor $R_2$ and generates a driving current $i_{P2}$ according to the driving control signal (i.e. the pull-up signal #U and the pull-down signal #D). For example, the charge pump 222 is connected to the second terminal of the resistor $R_1$ to provide/draw (sink) the driving current $i_{P2}$ to/from the second terminal of the resistor $R_1$ according the received pull-up signal #U and pull-down signal #D.

Similar to the charge pump 220, controller 210 also controls the charge pump 222. The controller 210 not only controls the magnitude of the driving current $i_P$ of the charge pump 220 through a first control signal #CCP1 and the magnitude of the current $i_K$ of the transconductance amplifier 202a through a current control signal #CA according to whether the channel selection signal #CS has be changed or not, but also controls the flow direction and magnitude of the driving current $i_{P2}$ through a second control signal #CCP2 according to whether the channel selection signal #CS has been changed or not. In channel switching process described in FIG. 2a, when the desired frequency has been locked or almost locked, the lowering of the driving current $i_P$, the driving current $i_{P2}$ and current $i_K$ are separated into multi-stages, the controller 210 lowers the values of the first control signal #CCP1, the second control signal #CCP2 and the current control signal #CA with a once per regular time interval until the driving current $i_P$ is lowered to a specific value such that the phase lock loop 100 reaches a smaller loop bandwidth.

Figure 3A:
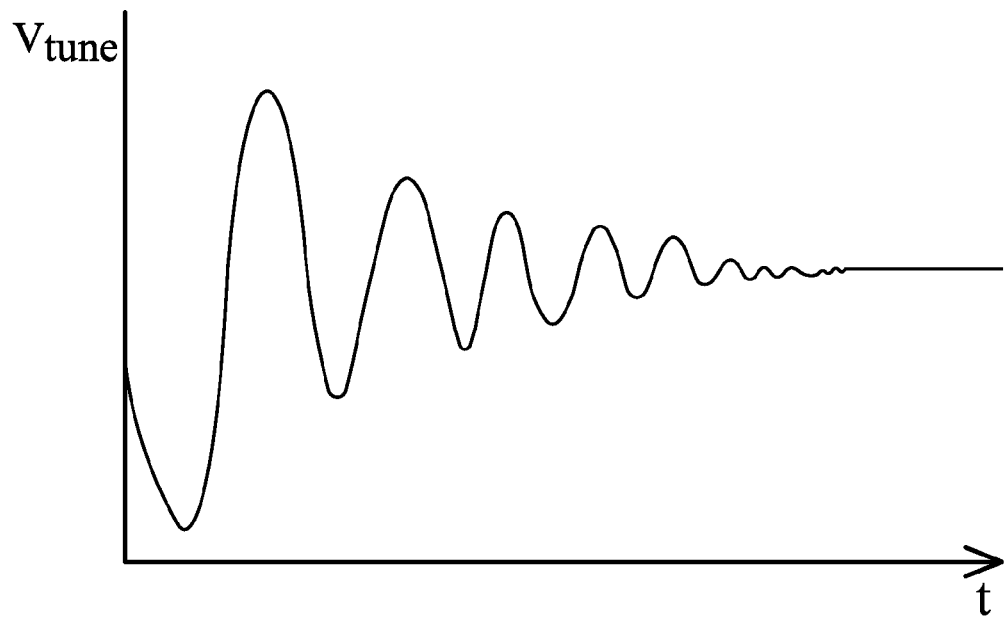
FIG. 3a shows a waveform of the driving voltage $V_{tune}$ of a conventional phase lock loop shown in FIG. 1 that only increases the driving current $i_P$ output from the charge pump into circuit to increase the loop bandwidth and loop gain.
Figure 3B:
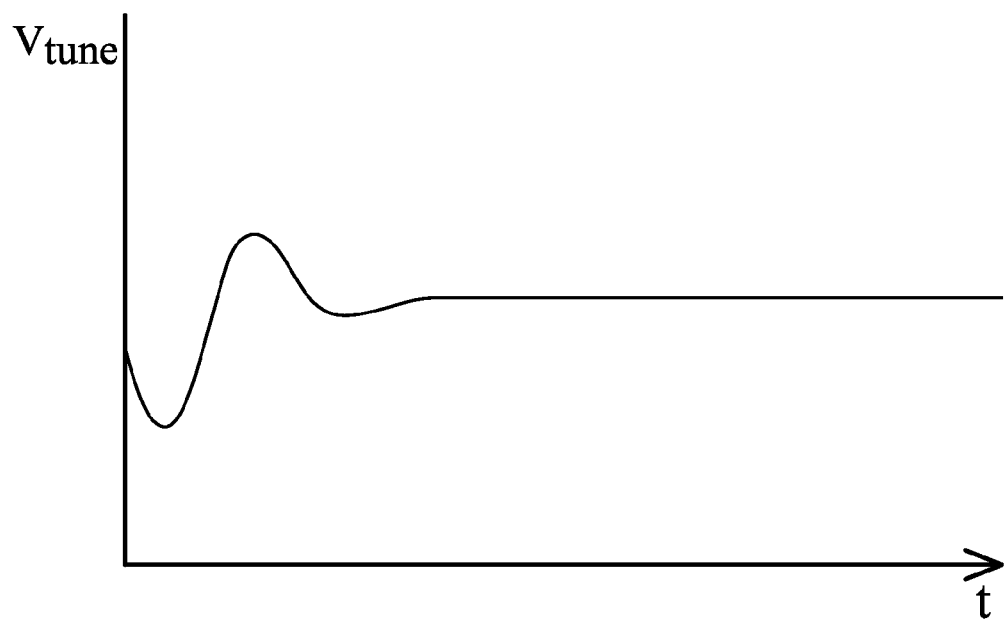
FIG. 3b shows a waveform of the driving voltage $V_{tune}$ according to the invention.

In order to explain the automatic-stabilization effect of the embodiment, please refer to FIG. 3a and FIG. 3b at the same time. FIG. 3a is a waveform of the driving voltage $V_{tune}$ of FIG. 1 that only increases the driving current $i_P$ output from the charge pump into the circuit to increase the loop bandwidth and loop gain. FIG. 3b is a waveform of the driving voltage $V_{tune}$ of FIG. 2a (FIG. 2b or FIG. 2c) that adds both the charge pump and transconductance amplifier into the circuit of FIG. 1. In FIG. 3a, the value of the driving voltage $V_{tune}$ oscillates severely with time before it is locked. On the contrary, in FIG. 3b, the value of the driving voltage $V_{tune}$ converges rapidly to a stable status such that the locking time can be decreased significantly.

Figure 3C:
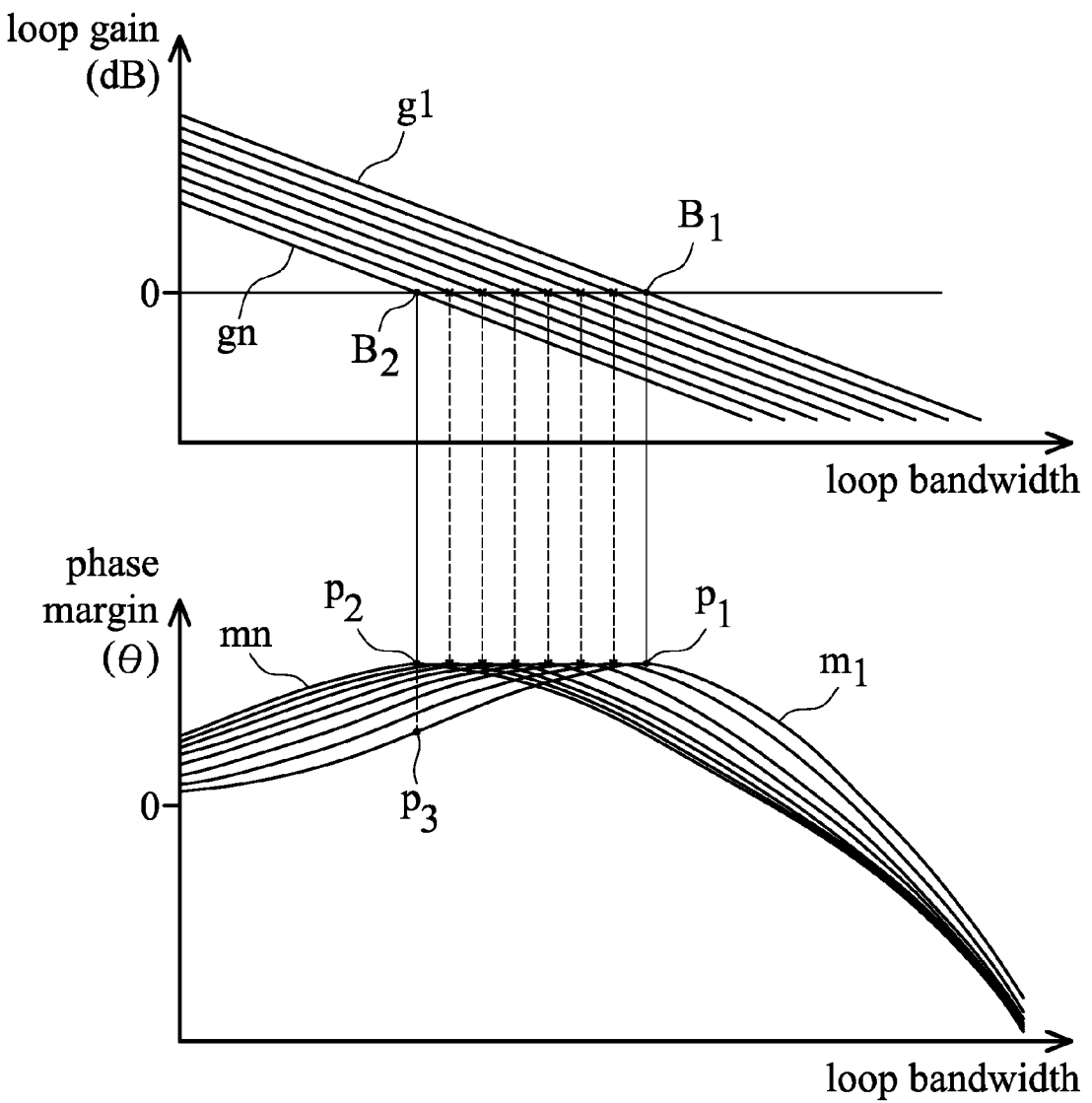
FIG. 3c is a diagram showing the relation between the loop bandwidth and phase margin according to the embodiment of the invention.

FIG. 3c is a diagram showing the relation between the loop bandwidth and phase margin according to the embodiment of the invention. The horizontal axis represents the loop bandwidth f, the upper vertical axis represents the loop gain and the lower vertical axis represents the phase margin. The line segment $g_1$ represents the loop gain before channel switching, and the curve $m_1$ represents the phase curve corresponding to the line segment $g_1$. As shown in FIG. 3c, the loop gain and phase margin vary with different ranges of the loop bandwidth f. In bode diagram shown in FIG. 3c, the line segment g1 cross zero decibel (dB) at $B_1$ corresponding to an apex $P_1$ of the curve $m_1$. The phase value corresponding to the apex $P_1$ is the phase margin of the intersection $B_1$. If the controller 210 shown in FIG. 2a lowers the current on the node A (i.e., the driving current $i_P$ and the current $i_K$) with time, then the line segment $g_1$ shifts in parallel to line segment gn. If the low-pass filter 230 is not adjusted synchronously, then the phase margin is at the intersection $P_3$ of the curve $m_1$. The value of the phase margin of the intersection $P_3$ may be very small such that the phase lock loop enters an unstable status. According to the embodiment of the invention, the transconductance amplifier 202a is simultaneously controlled by the current control signal #CA of the controller 210 to change the magnitude of the current $i_K$, and hence the phase curve is also shifted in parallel with time. In this way, when the upper loop gain shifts to the line segment gn, the lower phase margin curve shifts to curve mn such that the intersection $B_2$ representing zero loop gain corresponds to apex $P_2$. In contrast with intersection $P_3$, intersection $P_2$ is efficiently maintained within stable phase margin. Because the charge pump 220 and transconductance amplifier 202a are simultaneously controlled by the controller 210 to lower the current such that apex $P_1$ is moved to apex $P_2$ when intersection $B_1$ is moved to intersection $B_2$. In other words, the phase margin can be maintained in a stable range continuously.

Figure 4A:
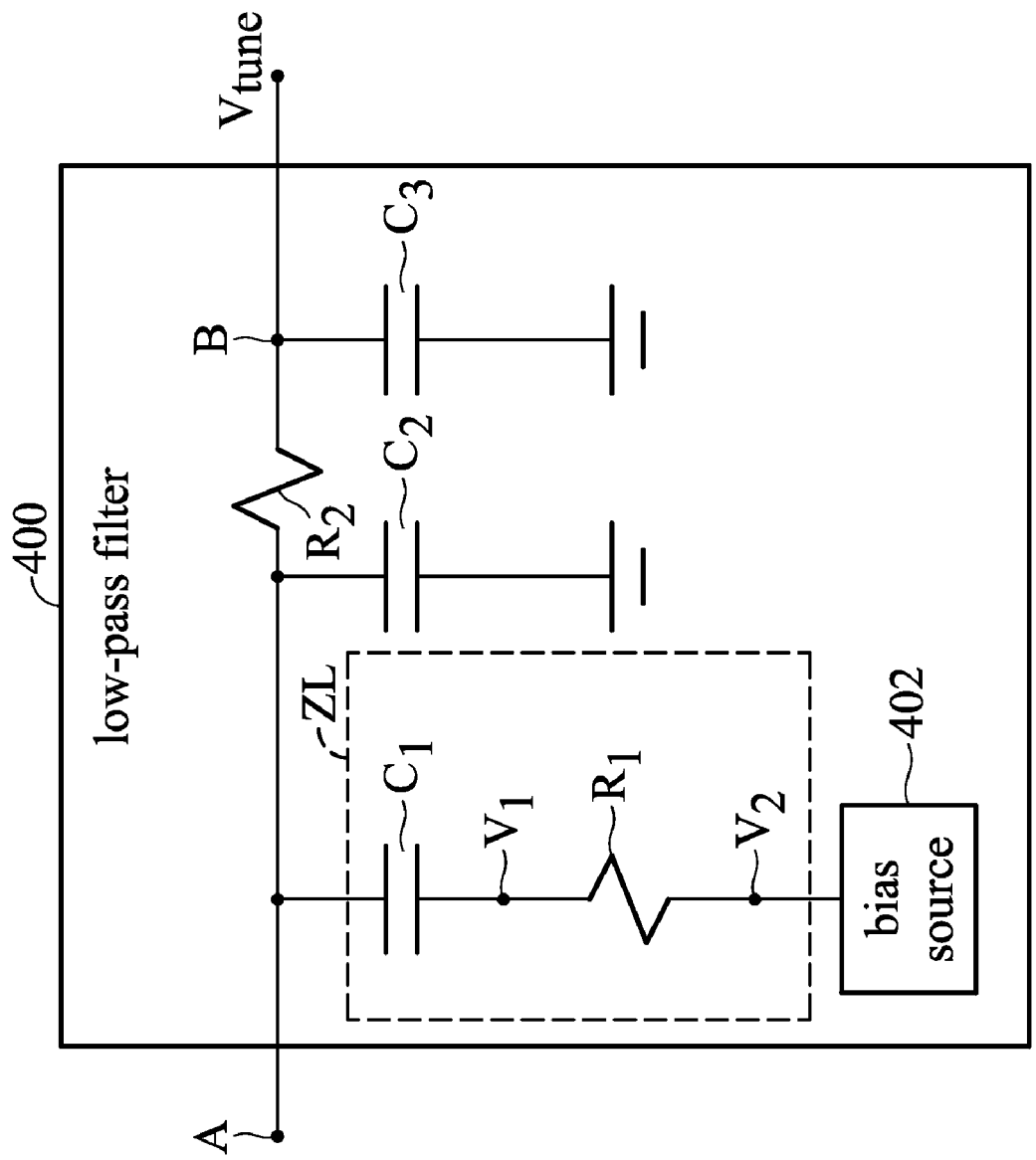
FIG. 4a, FIG. 4b and FIG. 4c are low-pass filters according to the invention.
Figure 4B:
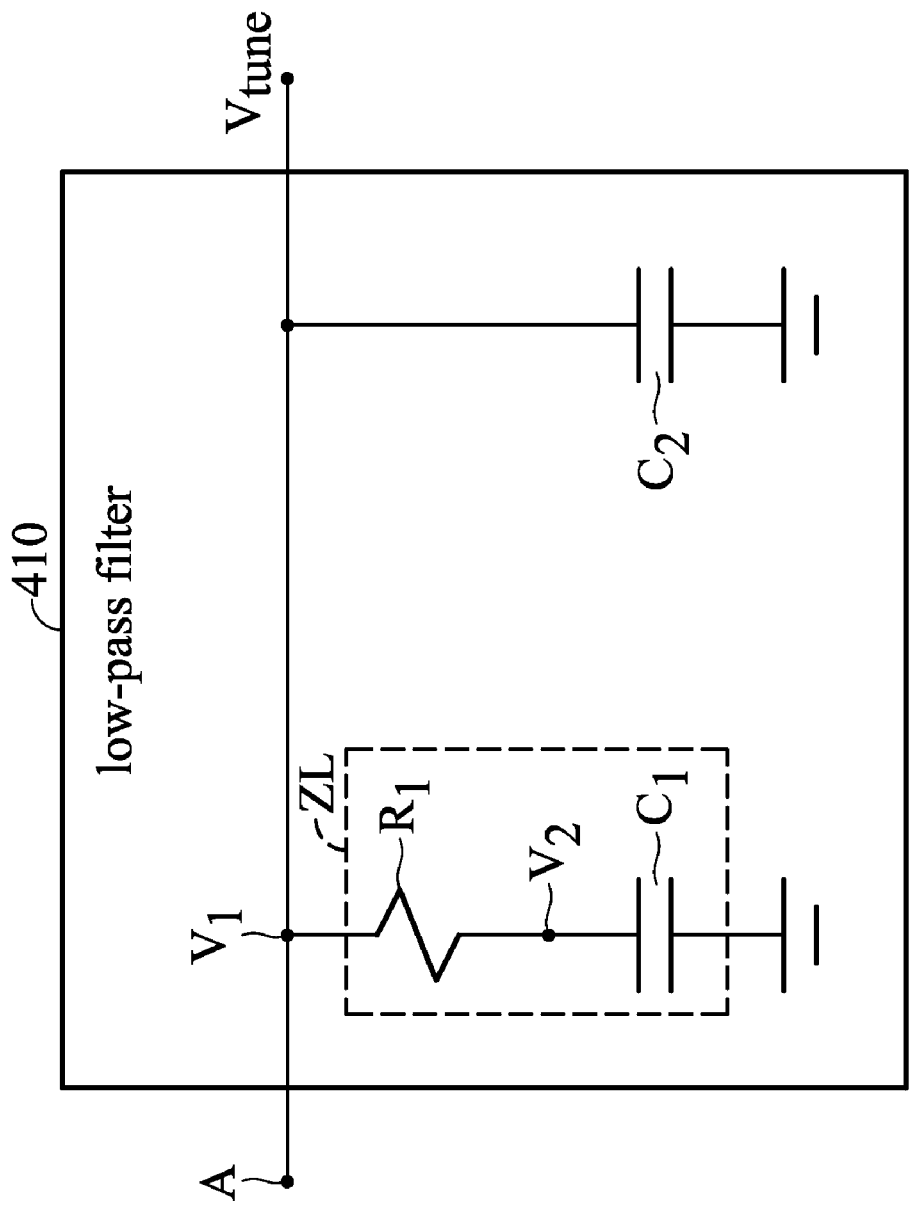
Figure 4C:
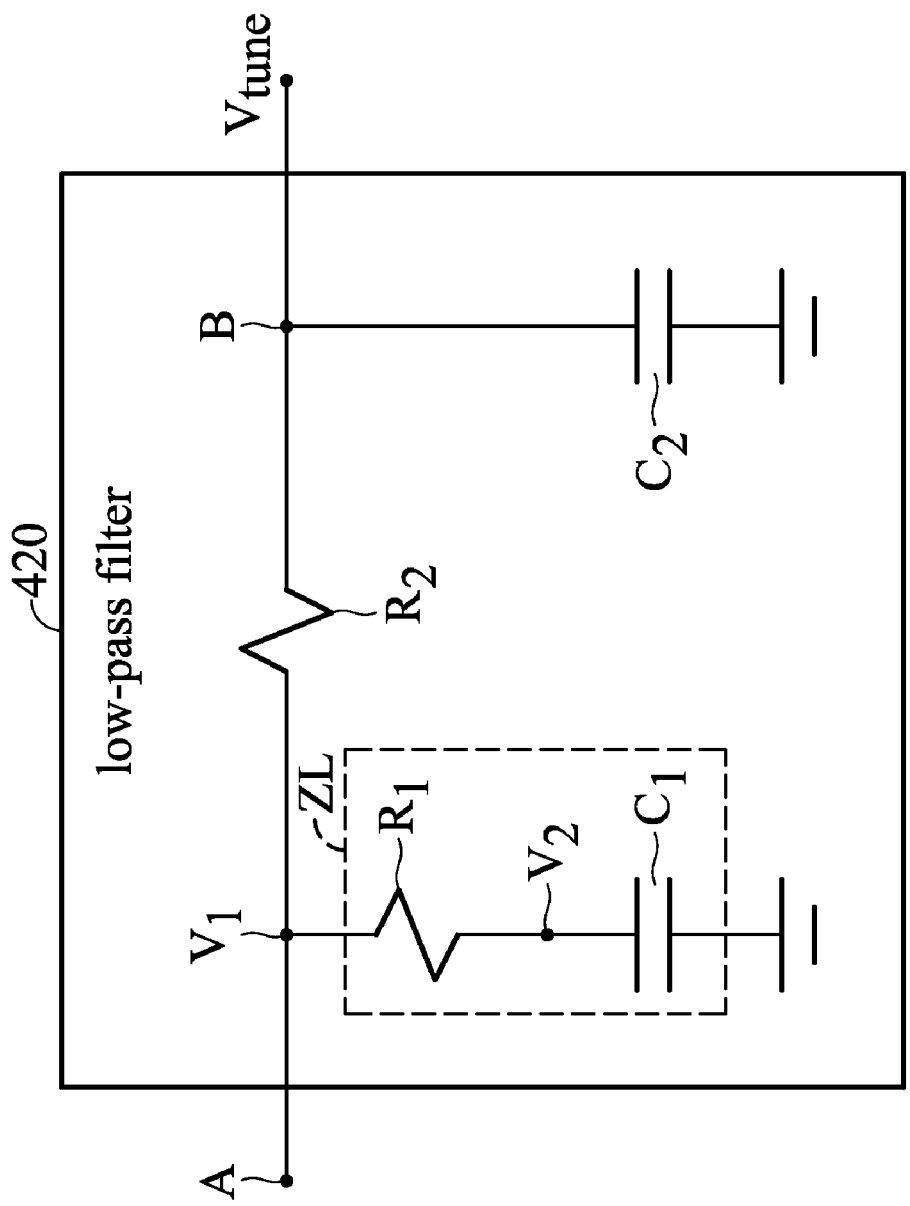

In actual circuit configuration, the low-pass filters 230 shown in FIG. 2a, FIG. 2b and FIG. 2c may have several variations. For example, FIGS. 4a~4c show the embodiments according to different low-pass filters of the invention, which are used to replace the low-pass filters in FIGS. 2a~2c. In the low-pass filter 400 shown in FIG. 4a, the capacitor $C_1$ has a first terminal coupled to the node A, and the resistor $R_1$ has a first terminal coupled to the second terminal of the capacitor $C_1$ and a second terminal coupled to a bias source 402. The capacitor $C_2$ has a first terminal coupled to the node A and a second terminal coupled to the ground, and the resistor $R_2$ has a first terminal coupled to the node A and a second terminal coupled to a node B. The capacitor $C_3$ has a first terminal coupled to the second terminal of the resistor $R_2$ and a second terminal coupled to the ground. In the embodiment, the resistor $R_1$ and the capacitor $C_1$ form the zero-point path ZL, and the node B outputs the driving voltage $V_{tune}$. The bias source 402 may be the ground, or a bias circuit providing a voltage less than supply voltage (VDD).

In FIG. 4b, a low-pass filter 410 only uses the capacitor $C_1$, the capacitor $C_2$ and the resistor $R_1$. The zero-point path ZL is composed of the resistor $R_1$ and the capacitor $C_1$ to form the zero-point of the equivalent frequency transfer function. The resistor $R_1$ has a first terminal coupled to the node A and a second terminal coupled to the capacitor $C_1$. The capacitor C1 has a first terminal coupled to a first terminal coupled to the second terminal of the resistor $R_1$ and a second terminal coupled to the ground. The capacitor $C_2$ has a first terminal coupled to the node A and a second terminal coupled to the ground, in which the voltage on the node A equals the driving voltage $V_{tune}$.

In FIG. 4c, a low-pass filter 420 uses two capacitors $C_1$ and $C_2$, and two resistors $R_1$ and $R_2$. The zero-point path ZL is composed of the resistor $R_1$ and the capacitor $C_1$ to form the zero-point of the equivalent frequency transfer function. The resistor $R_1$ has a first terminal coupled to node A and a second terminal coupled to the capacitor $C_1$, and the capacitor $C_1$ has a first terminal coupled to the second terminal of the resistor $R_1$ and a second terminal coupled to the ground. The resistor $R_2$ has a first terminal coupled to node A and second terminal coupled to node B, and the capacitor $C_3$ has a first terminal coupled to the second terminal of the resistor $R_2$ and a second terminal coupled to the ground, in which the voltage on the node B equals to the driving voltage $V_{tune}$.

Figure 5:
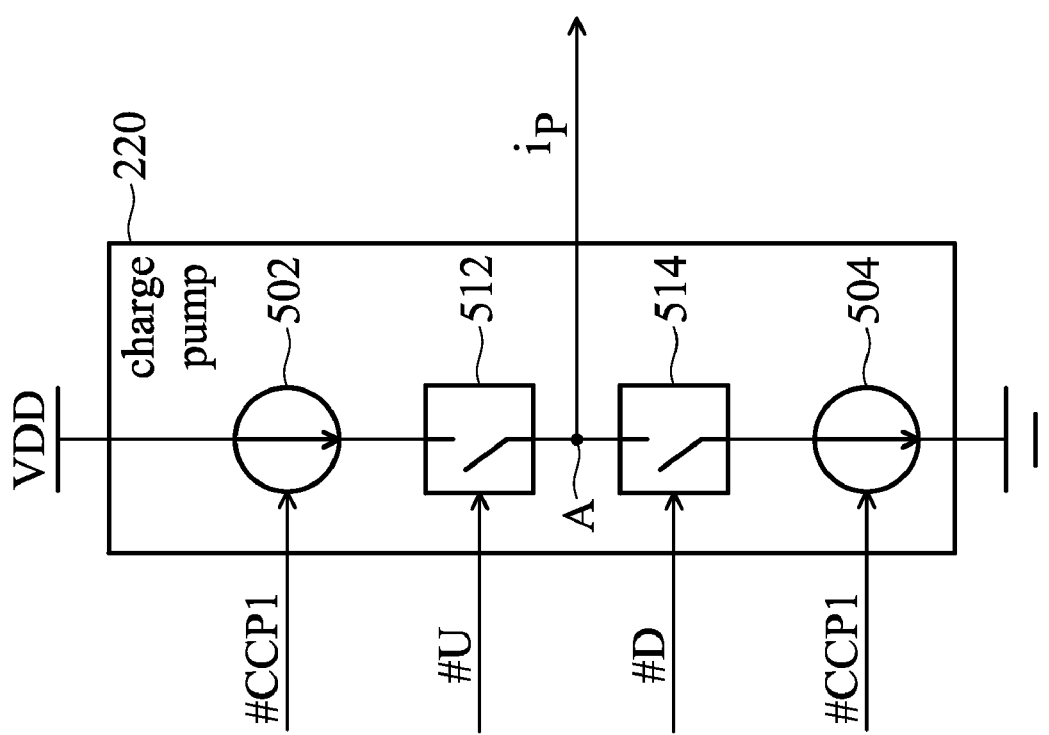
FIG. 5 shows an embodiment of the charge pump according to the invention.

FIG. 5 is an embodiment of a charge pump 220. Similar to the conventional charge pump; however, the charge pump 220 can be controlled by the first control signal #CCP1 to adjust the magnitude of the driving current $i_P$. A first current source 502 is connected to a supply voltage VDD to provide the driving current $i_P$ to the node A. A first switch 512 is connected between the first current source 502 and the node A, and controlled by the pull-up signal #U to be switched on or off. On the other hand, a second current source 504 is connected to the ground and used for drawing the driving current $i_P$ from the node A. A second switch 514 is connected between the second current source 504 and the node A, and controlled by the pull-down signal #D to be switched on or off. When the pull-up signal #U is enabled, the first switch turns on to conduct the driving current $i_P$ generated by the first current source 502 to the node A. Meanwhile, the pull-down signal #D is disabled, the second switch 514 turns off. When the pull-up signal #U is disabled, the first switch 512 turns off; however, the pull-down signal #D is enabled, and hence the second switch 514 turns on such that the second current source 504 provides the driving current $i_P$ from the node A. As described above, the charge pump 220 becomes a current pump, continuously providing and drawing the current by the switching of the pull-up signal #U and pull-down signal #D. The first current source 502 and the second current source 504 may be programmable circuits which determine the magnitude of the driving current $i_P$ generated by the first current source 502 and the second current source 504 according t the first control signal #CCP1.

The circuit configuration of the charge pump 222 shown in FIG. 2c is similar to the charge pump 220, the difference between the charge pump 220 and the charge pump 222 is that the output current $i_P$ is replaced by the output current $i_{P2}$. Detailed description is not included here for brevity.

Figure 6:
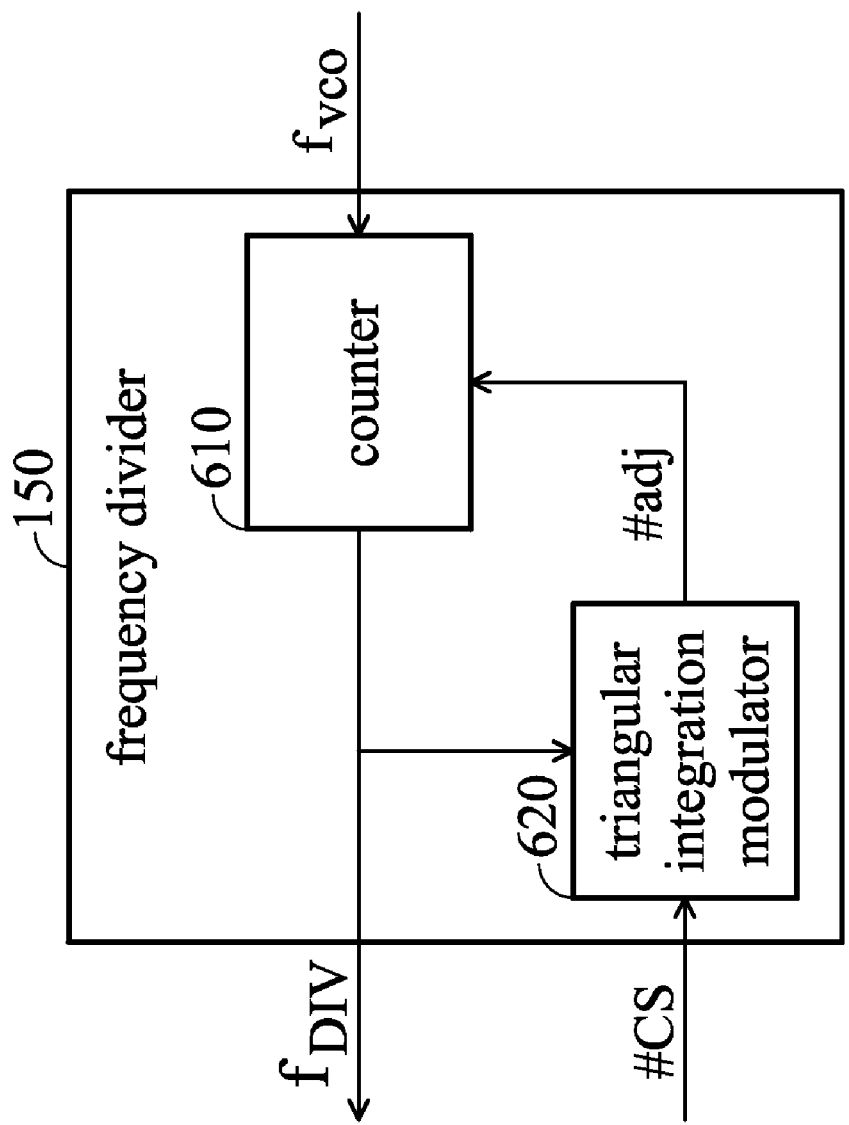
FIG. 6 shows an embodiment of the frequency divider according to the invention.

FIG. 6 shows an embodiment of a frequency divider 150. The invention is suitable for several variations of the phase lock loop. For example, the frequency divider 150 is a triangular integration frequency divider in the fractional-N type phase lock loop. As shown in FIG. 6, the frequency divider 150 comprises a counter 610 and a triangular integration modulator 620. The counter 610 is coupled to the output terminal of the voltage-control oscillator 140, and converts the output signal $f_{VCO}$ of the divided result $f_{DIV}$ according to an adjustment signal #adj. The triangular integration modulator 620 is coupled to the counter 610, and calculates the value of the adjustment signal #adj according to the divided result $f_{DIV}$ and the channel selection signal #CS. In the channel switching process, the noise generated from the channel switching of the frequency divider 150 can be decreased by the segmented lowered adjustment of the controller 210, which benefits the stable convergence of the driving voltage $V_{tune}$.

Figure 7A:
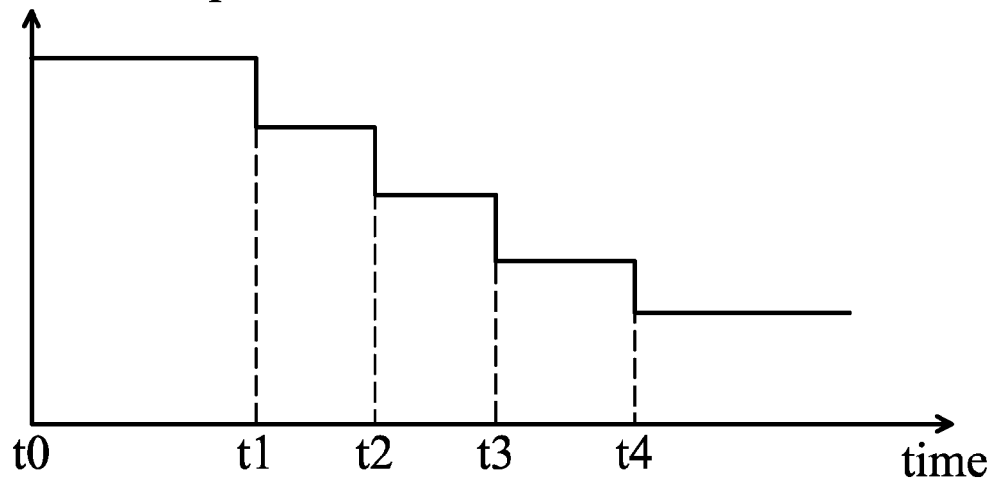
FIG. 7a, FIG. 7b and FIG. 7c show embodiments of the channel switching process according to the invention.
Figure 7B:
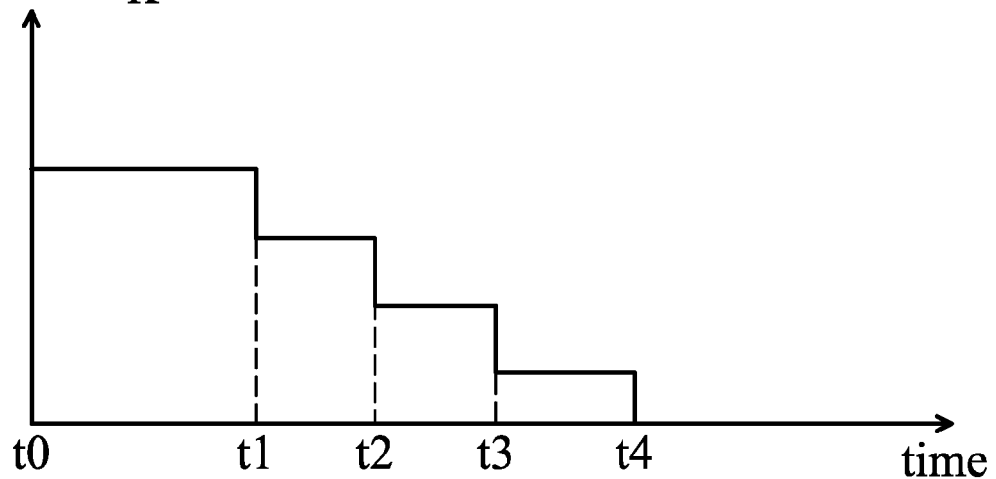

The FIG. 7a and FIG. 7b are embodiments of the channel switching process. At time t0, the channel selection signal #CS changes, and the controller 210 performs the channel switching process immediately. The controller 210 asserts the first control signal #CCP1 to increase the driving current $i_P$ such that the loop gain and bandwidth can be increased. The controller 210 also asserts the current control signal #CA to increase the current $i_K$ such that the stability of the phase lock loop can be maintained. At time t1, the first control signal #CCP1 and the current control signal #CA respectively lower the driving current $i_P$ and the current $i_K$ by the same ratio in order to decrease the loop gain and loop bandwidth and maintain a stable phase lock loop. Subsequently, at time t2, t3 and t4, the driving current $i_P$ and the current $i_K$ are lowered in sequence according to the control method at time $t_0$ until the phase lock loop reaches the required loop bandwidth. The current $i_K$ may be lowered to zero.

Figure 7C:
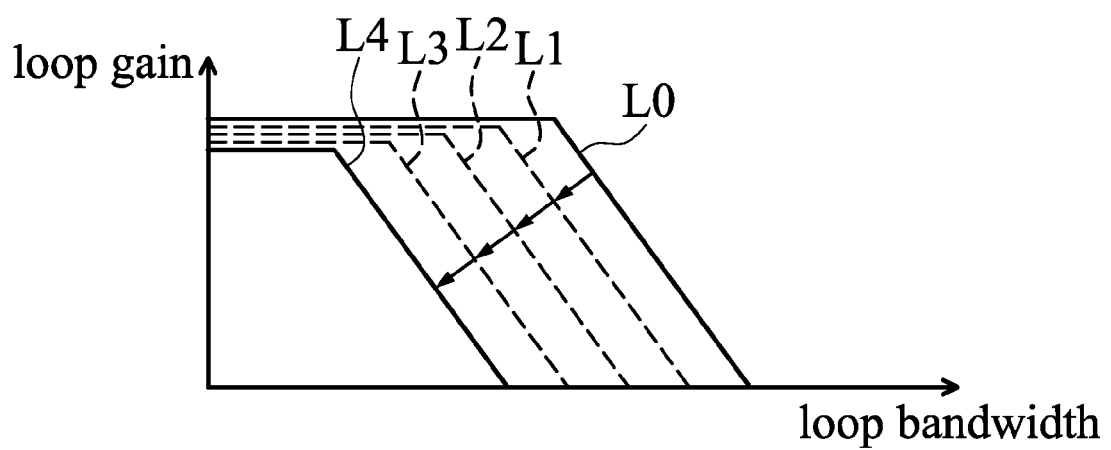

FIG. 7c shows the corresponding result. The horizontal axis of FIG. 7c represents the loop bandwidth, and the vertical axis represents the loop gain. In the channel switching process, the characteristics curve of the loop bandwidth shifts from L0 to L1, L2, L3 and L4 at timing t1, t2, t3, t4 because the charge pump is controlled by the adjustment of segmented lowering of the controller 210.

As described above, the embodiments of the invention provide a current adjustment configuration to improve the stability of the phase lock loop. In addition, the phase lock loop with the current adjustment configuration can also accompanied with an adjustment method for segmented lowering of the loop bandwidth such that the phase lock loop can lock its output frequency at the desired frequency quickly.

The foregoing description of the exemplary embodiments of the invention has been presented only for the purposes of illustration and description and is not intended to be exhaustive or to limit the invention to the precise forms disclosed. Many modifications and variations are possible in light of the above discussion. The embodiments were chosen and described in order to explain the principles of the invention and their practical application so as to encourage others skilled in the art to utilize the invention and its various embodiments. Alternative embodiments will become apparent to those skilled in the art for which the present invention pertains without departing from its spirit and scope. Accordingly, the scope of the present invention is defined by the appended claims rather than the foregoing description and the exemplary embodiments described therein.

What is claimed is:

1. A phase lock loop, comprising:
    a first charge pump coupled to a driving control signal to generate a first current;
    a filter coupled with the first charge pump at a first node, wherein the filter comprises a zero-point path; and
    a current adjustment circuit for adjusting a current on the first node according to a voltage drop in the zero-point path,
    wherein the current adjustment circuit is a transconductance amplifier.

2. The phase lock loop as claimed in claim 1, wherein the filter is a low-pass filter.

3. The phase lock loop as claimed in claim 1, wherein the driving control signal comprises a pull-up signal and a pull-down signal.

4. The phase lock loop as claimed in claim 1, wherein the zero-point path comprises at least a first resistor coupled to a first capacitor.

5. The phase lock loop as claimed in claim 1, wherein the zero-point path comprises at least a first resistor having a first terminal coupled to the first node and a second terminal coupled to a first capacitor, and the transconductance amplifier has first and second input terminals respectively coupled to the first and second terminals of the first resistor and an output terminal coupled to the first terminal of the first resistor.

6. The phase lock loop as claimed in claim 1, wherein the zero-point path comprises at least a first resistor having a first terminal coupled to the first node and a second terminal coupled to a first capacitor, and the transconductance amplifier has first and second input terminals respectively coupled to the first and second terminals of the first resistor and first and second output terminals respectively coupled to the first terminal and the second terminal of the first resistor.

7. The phase lock loop as claimed in claim 1, further comprising a second charge pump coupled to the driving control signal for generating a second current, wherein the zero-point path comprises at least a first resistor having a first terminal coupled to the first node and a second terminal coupled to a first capacitor and the second current, and the transconductance amplifier has first and second input terminals respectively coupled to the first and second terminals of the first resistor and an output terminal coupled to the first node.

8. The phase lock loop as claimed in claim 7, further comprising a controller to assert a first control signal to the first charge pump to control the magnitude of the first current, and assert a second control signal to the second charge pump to control the directions and magnitude of the second current according to whether a channel selection signal changes or not, and the controller further asserts a current control signal to the transconductance amplifier to control the magnitude of the current on the first node which is adjusted by the current adjustment circuit, wherein the second current is greater than the first current.

9. The phase lock loop as claimed in claim 8, wherein in the channel switching process, the controller simultaneously lowers the values of a first control signal, the second control signal and the current control signal per regular time intervals by a way of multi-stage lowering until an output signal of the phase lock loop converges to the locked status.

10. The phase lock loop as claimed in claim 1, wherein the filter comprises:
   a first resistor having a first terminal coupled to the first node;
   a first capacitor having a first terminal coupled to a second terminal of the first resistor and a second terminal coupled to a ground, wherein the first resistor and the first capacitor form the zero-point path;
   a second capacitor having a first terminal coupled to the first node and a second coupled to the ground;
   a second resistor having a first terminal coupled to the first node and a second terminal coupled to a second node; and
   a third capacitor having a first terminal couple to the second terminal of the second resistor and a second terminal coupled to the ground, wherein a driving voltage is output from the second node.

11. The phase lock loop as claimed in claim 1, wherein the filter comprises:
   a first capacitor having a first terminal coupled to the first node;
   a first resistor having a first terminal coupled to a second terminal of the first capacitor and a second terminal coupled to a bias source, wherein the first resistor and the first capacitor form the zero-point path;
   a second capacitor having a first terminal coupled to the first node and a second terminal coupled to a ground;
   a second resistor having a first terminal coupled to the first node and a second terminal coupled to a second node, wherein a driving voltage is output from the second node; and
   a third capacitor having a first terminal coupled to the second terminal of the second resistor and a second terminal coupled to the ground.

12. The phase lock loop as claimed in claim 11, wherein the bias source is the ground or a bias circuit providing a supply voltage less than the supply voltage of the first charge pump.

13. The phase lock loop as claimed in claim 1, wherein the filter comprises:
   a first resistor having a first terminal coupled to the first node;
   a first capacitor having a first terminal coupled to a second terminal of the first resistor and a second terminal coupled to a ground, wherein the first resistor and the first capacitor construct the zero-point path; and
   a second capacitor having a first terminal coupled to the first node and a second terminal coupled to the ground.

14. The phase lock loop as claimed in claim 1, wherein the filter comprises:
   a first resistor having a first terminal coupled to the first node;
   a first capacitor having a first terminal coupled to a second terminal of the first resistor and a second terminal coupled to a ground, wherein the first resistor and the first capacitor construct the zero-point path;
   a second resistor having a first terminal coupled to a first node and a second terminal coupled to a second node, wherein a driving voltage is output from the second node; and
   a second capacitor having a first terminal coupled to a second terminal of the second resistor and a second terminal coupled to the ground.

15. The phase lock loop as claimed in claim 1, wherein the first charge pump comprises:
   a first current source connecting a supply voltage to provide the first current to the first node of the zero-point path;
   a first switch coupled between the first current source and the first node, and controlled by the driving control signal to turn on or off;
   a second current source coupled to a ground for sinking the first current from the first node; and
   a second switch coupled between the second current source and the first node, and controlled by the driving control signal to turn on or off;
   wherein a first control signal determines the magnitude of the first current generated by the first and second current source.

16. The phase lock loop as claimed in claim 1, further comprising:
   a voltage-control oscillator coupled to the filter, generating an output signal; and
   a frequency divider for dividing the output signal by a frequency division ratio and generating a divided result.

17. The phase lock loop as claimed in claim 16, wherein the frequency divider receives a channel selection signal and adjusts the frequency division ratio according to the channel selection signal, and the phase lock loop determines the frequency range of the output signal according to a reference signal and the frequency division ratio.

18. The phase lock loop as claimed in claim 16, further comprising a phase frequency detector coupled to the frequency divider for receiving a reference signal and the divided result, and outputting the driving control signal according to the phase relation between the reference signal and divided result.

19. The phase lock loop as claimed in claim 18, wherein if a value of the channel changes, the controller magnifies the values of the first control signal and the current control signal by specific magnifications for initiating a channel switching process, and in the channel switching process, the controller lowers the values of the first control signal and the current control signal such that the magnitude of the first current and the magnitude of the current on the first node which is adjusted by the current adjustment circuit are lowered simultaneously with time.

20. The phase lock loop as claimed in claim 19, wherein in the channel switching process, the controller lowers the values of the first control signal and the current control signal once per regular time interval by way of multi-level lowering until an output signal of the phase lock loop converges to a locked status.

21. The phase lock loop as claimed in claim 20, wherein the controller stops lowering the values of the first control signal and the current control signal to finish the channel switching process when the output signal converges to the locked status.

22. The phase lock loop as claimed in claim 16, wherein the frequency divider comprises:
   a counter for converting the outputting signal into the divided result according to an adjustment signal; and
   a triangular integration modulator for calculating a value of the adjustment signal according to the divided result and a channel selection signal.

23. The phase lock loop as claimed in claim 1, further comprising a controller to assert a first control signal to the first charge pump to control the magnitude of the first current, and assert a current control signal to the transconductance amplifier to control the magnitude of the current on the first node which is adjusted by the current adjustment circuit according to whether a value of a channel selection signal changes or not.

24. A control method for a phase lock loop, wherein the phase lock loop comprises a phase frequency detector, a first charge pump, a low-pass filter, a voltage-control oscillator and a frequency divider, the control method comprises:
  generating a first current outputting to a first node according to a driving control signal, wherein the first charge pump and the low-pass filter are coupled at a first node;
  adjusting a current on the first node according to a voltage drop in the zero-point path of the low-pass filter; and
  providing a second current to a second terminal of the zero-point path by a transconductance amplifier, wherein the magnitude of the second current is equal to that of the first current.

25. The control method as claimed in claim 24, further comprising generating a second current and conducting the second current to a second terminal of the zero-point path by a second charge pump according to the driving control signal.

26. The control method as claimed in claim 25, further comprising asserting a first control signal to control the magnitude of the first current, a second control signal to control the directions and magnitude of the second current and a current control signal to control the magnitude of the current on the first node which is adjusted by the current adjustment circuit according to whether a channel selection signal changes or not, wherein the second current is greater than the first current.

27. The control method as claimed in claim 26, wherein in the channel switching process, values of a first control signal, the second control signal and the current control signal are simultaneously lowered per regular time interval by way of multi-level lowering until an output signal of the phase lock loop converges toward a lock-in status.

28. The control method as claimed in claim 24, further comprising asserting a first control signal to the first charge pump to control the magnitude of the first current, and asserting a current control signal to a transconductance amplifier to control the magnitude of the current on the first node which is adjusted by the current adjustment circuit, according to whether the value a channel selection signal changes or not.

29. The control method as claimed in claim 28, wherein if a value of the channel changes, values of the first control signal and the current control signal are magnified by specific magnifications for initiating a channel switching process, and in the channel switching process, the values of the first control signal and the current control signal are lowered such that the magnitude of the first current and the magnitude of the current on the first node which is adjusted by the current adjustment circuit are lowered simultaneously with time.

30. The control method as claimed in claim 29, wherein in the channel switching process, the values of the first control signal and the current control signal are lowered once per regular time intervals by way of multi-level lowering until an output signal of the phase lock loop converges to a locked status.

31. The control method as claimed in claim 24, further comprising:
  generating an output signal;
  dividing the output signal by a frequency division ratio and generating a divided result; and
  outputting the driving control signal according to the phase relation between the reference signal and divided result.

* * * * *